(12) United States Patent
Hyde et al.

(10) Patent No.: US 7,993,800 B2
(45) Date of Patent: *Aug. 9, 2011

(54) MULTILAYER ACTIVE MASK LITHOGRAPHY

(75) Inventors: Roderick A. Hyde, Redmond, WA (US); Nathan P. Myhrvold, Medina, WA (US)

(73) Assignee: The Invention Science Fund I, LLC, Bellevue, WA (US)

( * ) Notice: Subject to any disclaimer, the term of this patent is extended or adjusted under 35 U.S.C. 154(b) by 361 days.

This patent is subject to a terminal disclaimer.

(21) Appl. No.: 12/287,682

(22) Filed: Oct. 10, 2008

(65) Prior Publication Data

US 2009/0117475 A1 May 7, 2009

Related U.S. Application Data

(63) Continuation-in-part of application No. 11/132,736, filed on May 19, 2005, now Pat. No. 7,473,499, and a continuation-in-part of application No. 11/413,958, filed on Apr. 27, 2006, now Pat. No. 7,435,514, and a continuation-in-part of application No. 11/580,526, filed on Oct. 12, 2006, now Pat. No. 7,514,345.

(51) Int. Cl.
*G03F 1/00* (2006.01)
*G03C 5/00* (2006.01)
*H01L 21/22* (2006.01)

(52) U.S. Cl. ............ 430/5; 430/313; 430/311; 438/542; 438/5; 700/121

(58) Field of Classification Search ............... 430/5, 313, 430/311; 438/542, 5; 700/121
See application file for complete search history.

(56) References Cited

U.S. PATENT DOCUMENTS

| | | | |
|---|---|---|---|
| 6,365,326 B1 | 4/2002 | Surendra et al. | |
| 6,433,465 B1 | 8/2002 | McKnight et al. | |
| 6,521,383 B2 | 2/2003 | Surendra et al. | |
| 6,543,110 B1 | 4/2003 | Pelrine et al. | |
| 6,586,859 B2 | 7/2003 | Kornbluh et al. | |
| 6,681,849 B2 | 1/2004 | Goodson, Jr. | |
| 6,696,220 B2 | 2/2004 | Bailey et al. | |
| 6,753,131 B1 | 6/2004 | Rogers et al. | |
| 6,781,284 B1 | 8/2004 | Pelrine et al. | |
| 6,806,621 B2 | 10/2004 | Heim et al. | |
| 6,809,462 B2 | 10/2004 | Pelrine et al. | |
| 7,435,514 B2 * | 10/2008 | Hyde et al. ..................... 430/5 |
| 7,473,499 B2 | 1/2009 | Hyde et al. | |
| 7,514,345 B2 | 4/2009 | Hyde et al. | |
| 2002/0101253 A1 | 8/2002 | Pletner et al. | |
| 2002/0160313 A1 | 10/2002 | Park et al. | |
| 2003/0080442 A1 | 5/2003 | Unger | |
| 2003/0081193 A1 | 5/2003 | White et al. | |
| 2003/0141473 A1 | 7/2003 | Pelrine et al. | |
| 2006/0057505 A1 | 3/2006 | Sadwick et al. | |

(Continued)

OTHER PUBLICATIONS

Bar-Cohen, Yoseph; "Electroactive Polymers as Artificial Muscles—Reality and Challenges"; Proceedings of the 42nd AIAA Structures, Structural Dynamics, and Materials Conference (SDM), Gossamer Spacecraft Forum (GSF); bearing dates of Apr. 16-19, 2001; pp. 1-10; Paper #2001-1492; Seattle, Washington; located at http://ndeaa.jpl.nasa.gov/ndeaa-pub/AIAA/AIAA-EAP-review-2001.pdf.

(Continued)

*Primary Examiner* — Nikita Wells

(57) ABSTRACT

An active mask emits a patterned energy flux in response to an energy input.

106 Claims, 5 Drawing Sheets

U.S. PATENT DOCUMENTS

| | | |
|---|---|---|
| 2006/0238079 A1 | 10/2006 | Pei et al. |
| 2008/0099667 A1 | 5/2008 | Stark et al. |
| 2008/0111058 A1 | 5/2008 | Feldman et al. |
| 2008/0211491 A1 | 9/2008 | Huang et al. |
| 2009/0117475 A1 | 5/2009 | Hyde et al. |
| 2009/0130573 A1* | 5/2009 | Hyde et al. .................. 430/5 |
| 2009/0242806 A1 | 10/2009 | Hyde et al. |
| 2010/0165134 A1* | 7/2010 | Dowski et al. .............. 348/218.1 |
| 2010/0326071 A1 | 12/2010 | Gracias et al. |

OTHER PUBLICATIONS

Bermudez, H.; Aranada-Espinoza, H.; Hammer, D.A.; Discher, D.E.; "Pore Stability and Dynamics in Polymer Membranes"; bearing a date of Nov. 22, 2002; pp. 1-4.

Bier, Martin; Gowrishankar, T.R.; Chen, Wei; Lee, Raphael C.; "Electroporation of a Lipid Bilayer as a Chemical Reaction"; Bioelectromagnetics bearing a date of 2004; pp. 634-637; vol. 25.

Cohen, J.Y.; "Electroactive Polymers as Artificial Muscles—A Primer"; bearing dates of 2003 and Nov. 9, 2004; pp. 1-14; located at http://polysep.ucla.edu/Research%20Advances/EAP/electroactive_polymers_as_artifi.htm; printed on Apr. 15, 2005.

Kik, Pieter G.; Martin, Andrea L.; Maier, Stefan A.; Atwater, Harry A.; "Metal nanoparticle arrays for near field optical lithography"; SPIE Proceedings (2002); pp. 1-7; located at http://kik.creol.ucf.edu/publications/2002-kik-spie.pdf.

Kik, Pieter G.; Maier, Stefan A.; Atwater, Harry A.; "Plasmon printing—a new approach to near-field lithography"; Mat. Res. Soc. Symp. Proc. 705, Y3.6 (2002); pp. 1-6; located at http://kik.creol.ucf.edu/publications/2002-kik-mrs.pdf.

Luo, Xiangang; Ishihara, Teruya; "Surface plasmon resonant interference nanolithography technique"; Applied Physics Letters; Jun. 7, 2004; pp. 1-3; vol. 84, No. 23.

Moroz, David J.; Nelson, Philip; "Dynamically-Stabilized Pores in Bilayer Membranes"; bearing dates of Sep. 1996 and May 14, 1997; pp. 1-7.

PCT International Search Report; International App. No. PCT/US07/10305; Jul. 22, 2008; pp. 1-3.

Tsong, Tian Y.; "Electroporation of cell membranes"; Biophysics Journal; bearing a date of Aug. 1991; pp. 297-306; vol. 60; Biophysical Society.

Xia, Younan; Whitesides, George M.; "Soft Lithography"; Annual Review Material Science; bearing a date of 1998; pp. 153-184; vol. 28:153-84; located at http://web.mit.edu/10.491/softlithographyreview.pdf.

USPTO Office Action; U.S. Appl. No. 12/384,478; May 26, 2011; pp. 1-21.

* cited by examiner

MULTILAYER ACTIVE MASK LITHOGRAPHY

CROSS-REFERENCE TO RELATED APPLICATIONS

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)). All subject matter of the Related Applications and of any and all parent, grandparent, great-grandparent, etc. applications of the Related Applications is incorporated herein by reference to the extent such subject matter is not inconsistent herewith.

RELATED APPLICATIONS

For purposes of the USPTO extra-statutory requirements, the present application constitutes a continuation-in-part of U.S. patent application Ser. No. 11/132,736, entitled ELECTROACTIVE POLYMERS FOR LITHOGRAPHY, naming RODERICK A. HYDE and NATHAN P. MYHRVOLD as inventors, filed 19 May 2005 now U.S. Pat. No. 7,473,499, or is an application of which a currently co-pending application is entitled to the benefit of the filing date.

For purposes of the USPTO extra-statutory requirements, the present application constitutes a continuation-in-part of U.S. patent application Ser. No. 11/413,958, entitled ACTIVE MASK LITHOGRAPHY, naming RODERICK A. HYDE and NATHAN P. MYHRVOLD as inventors, filed 27 Apr. 2006 now U.S. Pat. No. 7,435,514, or is an application of which a currently co-pending application is entitled to the benefit of the filing date.

For purposes of the USPTO extra-statutory requirements, the present application constitutes a continuation-in-part of U.S. patent application Ser. No. 11/580,526, entitled ELECTROACTIVE POLYMERS FOR LITHOGRAPHY, naming RODERICK A. HYDE and NATHAN P. MYHRVOLD as inventors, filed 12 Oct. 2006 now U.S. Pat. No. 7,514,345, or is an application of which a currently co-pending application is entitled to the benefit of the filing date.

The United States Patent Office (USPTO) has published a notice to the effect that the USPTO's computer programs require that patent applicants reference both a serial number and indicate whether an application is a continuation or continuation-in-part. Stephen G. Kunin, *Benefit of Prior-Filed Application*, USPTO Official Gazette Mar. 18, 2003, available at http://www.uspto.gov/web/offices/com/sol/og/2003/week11/patbene.htm. The present Applicant Entity (hereinafter "Applicant") has provided above a specific reference to the application(s) from which priority is being claimed as recited by statute. Applicant understands that the statute is unambiguous in its specific reference language and does not require either a serial number or any characterization, such as "continuation" or "continuation-in-part," for claiming priority to U.S. patent applications. Notwithstanding the foregoing, Applicant understands that the USPTO's computer programs have certain data entry requirements, and hence Applicant is designating the present application as a continuation-in-part of its parent applications as set forth above, but expressly points out that such designations are not to be construed in any way as any type of commentary and/or admission as to whether or not the present application contains any new matter in addition to the matter of its parent application(s).

All subject matter of the Related Applications and of any and all parent, grandparent, great-grandparent, etc. applications of the Related Applications is incorporated herein by reference to the extent such subject matter is not inconsistent herewith.

BACKGROUND

Currently, lithography is the most complicated and expensive process in mainstream microelectronic fabrication. As required chip feature sizes grow ever smaller, lithography techniques are continually updated to achieve the desired resolution. Projection lithography systems may be limited in resolution due to limitations in depth of field for high numerical aperture optics. For certain types of lithography, greater resolution may be achievable using contact methods, in which a mask is placed in contact with a substrate.

SUMMARY

In one aspect, a lithographic mask includes a first and a second energy emitting layer. The first energy emitting layer includes a first active region configured to emit a first energy flux at a first selected intensity in response to an energy input, and the second energy emitting layer includes a second active region configured to emit a second energy flux at a second selected intensity in response to the first energy flux and a first inactive region configured not to emit an energy flux at the second selected intensity in response to the first energy flux. Either energy flux may be electromagnetic radiation, charged particles (e.g., electrons), an evanescent wave, or an electromagnetic field (e.g., a static or dynamic field, or a purely electric or purely magnetic field). When both energy fluxes are electromagnetic radiation, they may differ in frequency. Either energy emitting layer may be photoemissive, luminescent, or may include an active gain material (which may be configured to function as an optical cavity), a nonlinear optical material, an electrode, a quantum dot, a fluorescent material, a scintillation material, a photocathode, a field emission material, a waveguide, or a region supporting plasmon propagation. The energy input may be electrical or optical. The first energy emitting layer may include a second inactive region configured not to emit an energy flux at the first selected intensity in response to the energy input.

In another aspect, a lithographic mask includes a patterned energy emitting layer and a patterned transmissivity layer. The patterned energy emitting layer includes at least one active region configured to emit an energy flux at a selected level in response to an energy input and at least one inactive region configured not to emit an energy flux at the selected level in response to the energy input. The patterned transmissivity layer includes a first region having a first selected transmissivity to the energy flux and a second region having a second selected transmissivity to the energy flux, the second selected transmissivity differing from the first selected transmissivity (e.g., a negligible transmissivity). The energy flux may be electromagnetic radiation, an electromagnetic field, or a particle beam (e.g., an electron beam). The patterned energy emitting layer may include a fluorescent material, a luminescent material (e.g., a phosphor or a quantum dot), a nonlinear optical material, a gain material configured to amplify the energy input to produce the energy flux, a photocathode, a field emission material, an electrode, or a photoemissive material. The patterned transmissivity layer may be configured to transmit the energy flux through the first region to emerge as photons, plasmons, charged particles (e.g., electrons or holes), or an electromagnetic field.

In still another aspect, a lithographic mask includes a patterned transmissivity layer and an energy emitting layer. The patterned transmissivity layer includes a first region having a first selected transmissivity to an energy input and a second region having a second selected transmissivity to the energy input, the second selected transmissivity differing from the first selected transmissivity (e.g., a negligible transmissivity). The energy emitting layer may further include at least one inactive region configured not to emit an energy flux at the selected level in response to the transmitted energy input, in which case the inactive region may have a selected transmissivity to the transmitted energy input. The energy flux may be electromagnetic radiation, charged particles (e.g., electrons), or an electromagnetic field. The energy input may be electromagnetic radiation, an electromagnetic field, or a particle beam (e.g., an electron beam). The energy emitting layer may include an active gain material (which may be configured to function as an optical cavity), a nonlinear optical material, a fluorescent material, a luminescent material, a light-emitting diode, a scintillation material, a photocathode, a field emission material, a photoemissive material, a quantum dot, a waveguide, or a region supporting plasmon propagation.

In yet another aspect, a lithographic apparatus includes a patterned energy emitting mask and a substrate support. The patterned energy emitting mask includes at least one active region that emits an energy flux and at least one inactive region that does not emit an energy flux, and includes at least two layers, at least one of which is an energy emitting layer. The substrate support is arranged to hold a substrate in a position to receive the energy flux. The two layers may include two energy emitting layers (e.g., a patterned energy emitting layer and a homogeneous energy emitting layer, or two patterned energy emitting layers), or an energy emitting layer and a patterned transmissivity layer. The apparatus may further include a beam-directing element that directs the energy flux toward the substrate. The energy flux may be electromagnetic radiation, electrons, an evanescent wave, or an electromagnetic field (e.g., a static or dynamic field, or a purely electric or purely magnetic field). The patterned energy emitting mask may include a light emitting diode, a fluorescent material, a luminescent material, a photoemissive material, a nonlinear optical material, an active gain optical material, a quantum dot, an electrode, or an input configured to trigger emission of the energy flux (e.g., in response to an optical or electrical signal). The substrate support may be configured for relative movement between the substrate and the mask.

In a further aspect, a lithographic method includes generating an energy flux by activating a patterned energy emitting mask, and exposing a flux sensitive material to the generated energy flux at a level selected to modify the flux sensitive material. The patterned energy emitting mask includes at least one active region that emits an energy flux and at least one inactive region that does not emit an energy flux, and further includes at least two layers, at least one of the at least two layers being an energy emitting layer. The two layers may include two energy emitting layers (e.g., a patterned energy emitting layer and a homogeneous energy emitting layer, or two patterned energy emitting layers), or an energy emitting layer and a patterned transmissivity layer. The generated energy flux may be electromagnetic radiation, electrons, or an evanescent wave. Generating an energy flux may include generating an electromagnetic field (e.g., a static or dynamic field, or a substantially purely electric or substantially purely magnetic field). Activating the patterned energy emitting mask may include activating one or more light-emitting diodes, inducing luminescence in a luminescence material (e.g., by exposing a fluorescent material to electromagnetic radiation or by applying an electric field to the luminescent material), or applying a voltage to an electrode or to a field emissive material. In the latter cases, the electrode or field emissive material may be in contact with the substrate during application of the voltage. The flux sensitive material may include a lipid bilayer, in which case exposing the flux sensitive material to the generated energy flux may include forming pores in the lipid bilayer. The method may further include etching the lipid bilayer. The flux sensitive material may include a resist coating, and exposing the flux sensitive material to the generated energy flux may include inducing a chemical change in the resist coating. The exposed flux sensitive material may be modified in a pattern corresponding to the pattern of the patterned energy emitting mask.

In yet a further aspect, a lithographic mask includes a patterned energy emitting layer including at least one active region configured to emit an energy flux at a selected level in response to an energy input and at least one inactive region configured not to emit an energy flux at the selected level in response to the energy input. The active region includes an active gain material, a nonlinear optical material, a waveguide, a quantum dot, or a plasmon-supporting region.

In still a further aspect, a lithographic mask includes a patterned energy emitting layer including a first active region configured to emit a first energy flux at a selected level in response to an energy input and a second active region configured to emit a second energy flux at a second selected level in response to the energy input. The first and second energy fluxes differ in frequency or intensity.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
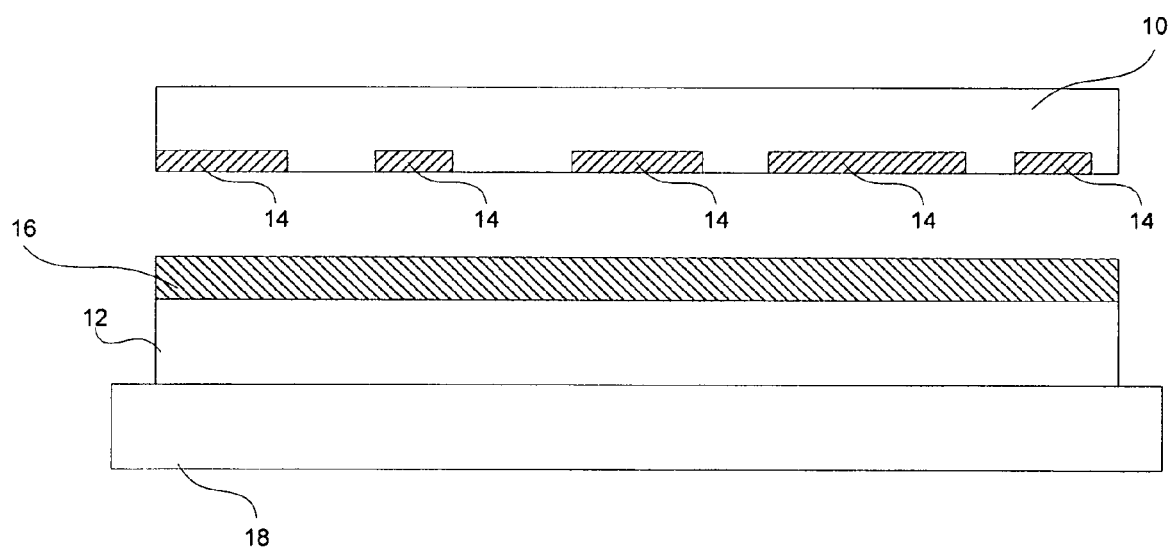
FIG. 1 is a schematic of one embodiment of an active mask and substrate.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Most modern lithographic systems use photomasks to expose substrates. The photomasks are generally passive devices that serve to block radiation in selected areas, thereby producing a pattern on a resist surface. Rather than simply acting to block external radiation, the present active masks themselves generate electromagnetic radiation or other outputs to expose a photoresist or otherwise interact with a substrate.

FIG. 1 is a schematic of one embodiment of an active mask 10 and substrate 12. The mask 10 includes a plurality of active regions 14. When activated, the active regions 14 act to expose a resist layer 16 on the substrate 12. The resist layer 16 (which may be either a positive or negative resist) may then be developed using lithographic techniques. In other embodiments, the resist may be absent, and the active regions may interact directly with the substrate material. The substrate 12 may be supported by a substrate support 18.

Figure 2:
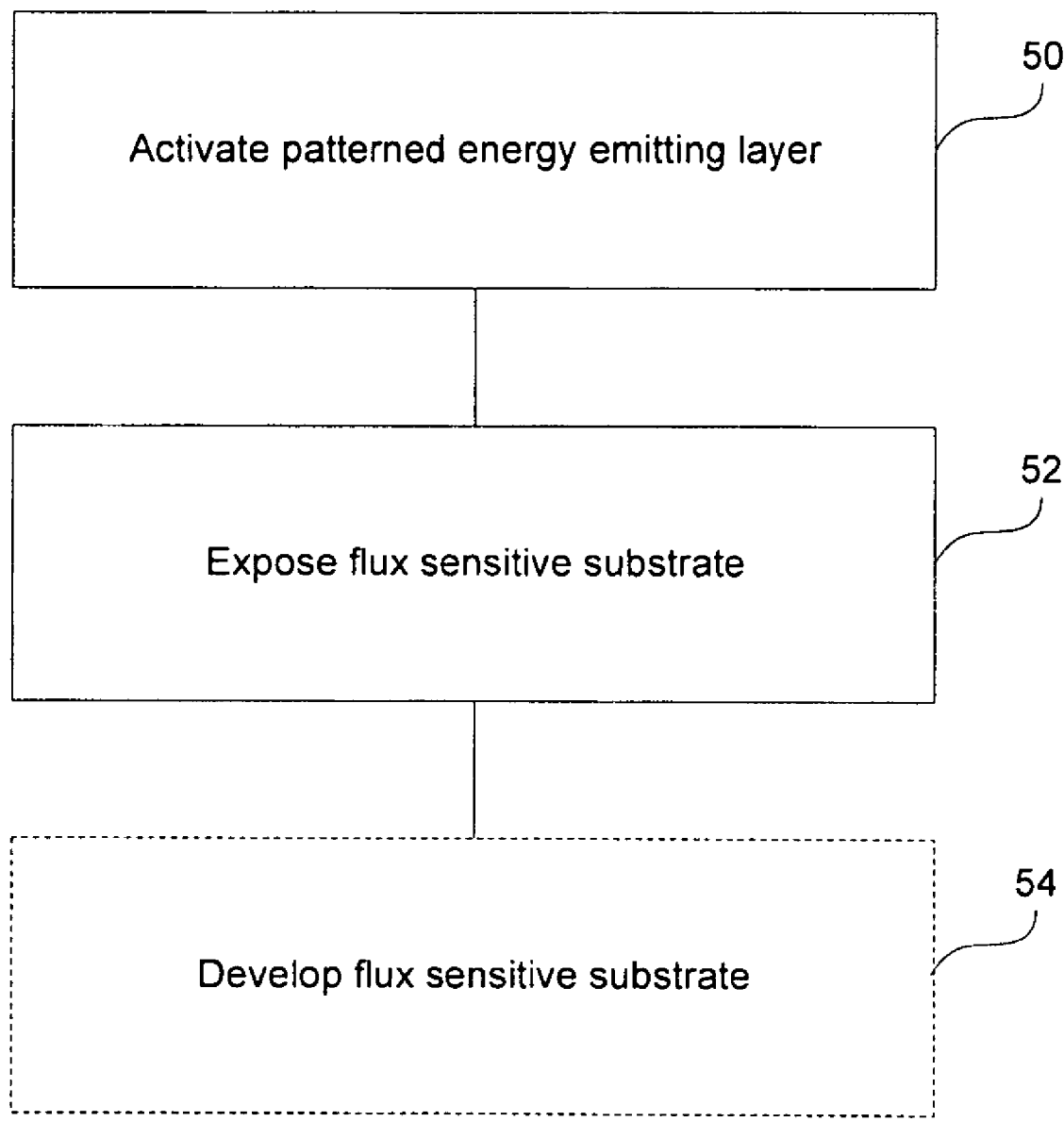
FIG. 2 is a flow chart describing one method of use of an active mask.

FIG. 2 is a flow chart describing one method of use of an active mask. The patterned energy emitting layer (which includes at least one active region and at least one inactive region) is activated 50 to generate an energy flux (e.g., an electromagnetic field, photons, or particles such as electrons). A flux sensitive substrate (e.g., a substrate coated with a resist composition or a lipid bilayer) is then exposed 52 to the energy flux at a level selected to modify the flux sensitive substrate. Optionally, the exposed substrate may be developed 54 after exposure (e.g., by etching a lipid bilayer, or by selectively removing resist from either the exposed or the unexposed area).

The active regions may take many forms. In some embodiments, the active regions generate electromagnetic radiation. For example, in some embodiments, the active regions may be light-emitting diodes that emit light in response to an electrical input, or they may include phosphors, photonic crystals, quantum dots, or fluorescent materials that emit light in response to an input of electromagnetic radiation, or they may include scintillation materials that emit light in response to an input of ionizing radiation. In some of these embodiments, such re-emitted light is at a lower frequency than the input light. The active regions may also include nonlinear optical materials or active gain materials, in which cases they may function as lasers pumped by the energy input. The active regions may also include waveguides. For example, a mask may include a waveguide configured to "leak" at the active regions (e.g., in response to a selectively actuatable electroactive polymer, as described elsewhere herein).

In some embodiments, the active regions may also produce static or dynamic magnetic, electric, or electromagnetic fields in response to an energy input (e.g., an applied voltage), or they may emit electrons or other particles. Different active regions may be configured to produce different energy fluxes in response to the same or to different energy inputs. For example, different active regions may produce light of different colors or intensities in response to the same electromagnetic radiation input. These different colors or intensities may interact differently with the resist, for example allowing a single mask to produce different patterns depending on the resist used.

Traditional masks typically have a fixed pattern of transmissive regions. Active masks may similarly have a fixed pattern of active regions, so that each exposed substrate is patterned according to the fixed pattern. Alternatively, the masks may be dynamic in nature. In some embodiments, the output of the masks may be controlled by controlling the input. For example, a mask that is activated by an applied voltage may have a plurality of regions that may be selectively activated depending on which of a number of voltage inputs are applied. A mask that is responsive to an optical input may also be activated by a selectively applied input. In other embodiments, the masks may be configured so that the active regions themselves change size, shape, or configuration. For example, a selectively actuatable electroactive polymer, such as those described in copending and commonly owned U.S. patent application Ser. No. 11/132,736, filed May 19, 2005 and incorporated herein by reference, may be used to change the configuration of an active mask. In some embodiments, this may be achieved by selectively bringing portions of the active mask into closer proximity to a substrate, thereby allowing them to expose the substrate. In some embodiments, contact with the selectively actuatable electroactive polymer may cause "leakage" from a waveguide, allowing light to escape only from regions contacted, for example because the waveguide is contacted by a material with an index or because the waveguide is deformed. Similarly, mechanical contact with an electroactive polymer may induce an electric field in a piezoelectric active layer to expose the resist.

Figure 3:
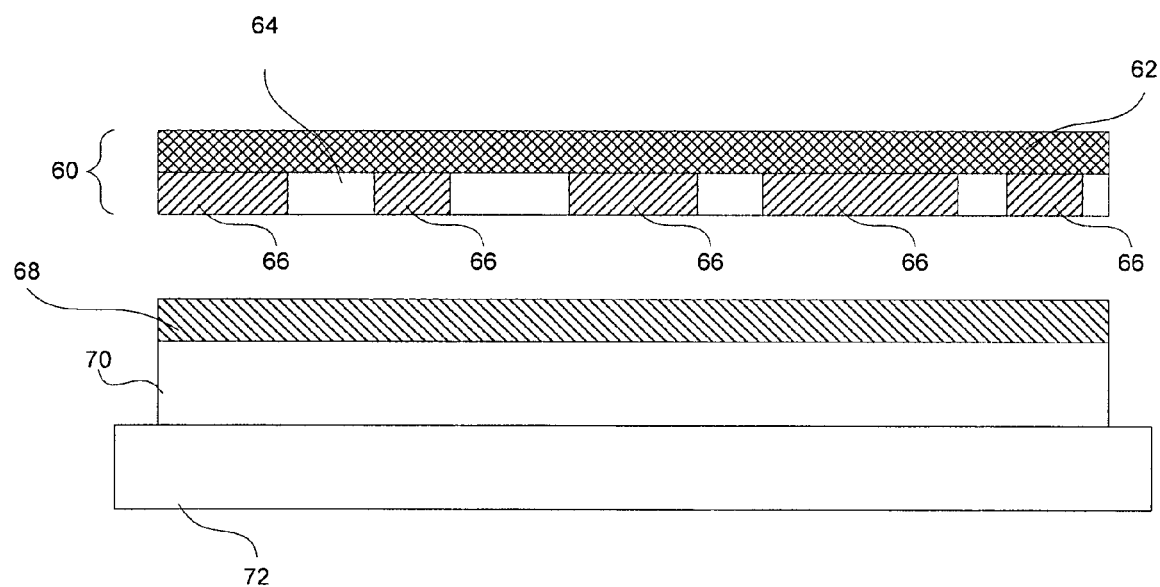
FIG. 3 is a schematic of a bilayer active mask including two active layers.

FIG. 3 is a schematic of an active mask 60 including two energy emitting layers 62, 64. In the illustrated embodiment, first layer 62 is a homogeneous light-emitting layer, but this layer may also be patterned as in the mask of FIG. 1. In some embodiments, this layer may emit other types of energy fluxes, such as charged particles (e.g., electrons, ions, or holes) or an electromagnetic field. Second layer 64 includes a plurality of active regions 66, which may be activated by receiving the light or other energy flux from first layer 62. When activated, the active regions 66 act to expose a resist layer 68 on the substrate 70. The resist layer 68 (which may be either a positive or negative resist) may then be developed using lithographic techniques. In other embodiments, the resist may be absent, and the active regions may interact directly with the substrate material. The substrate 70 may be supported by a substrate support 72.

First layer 62 and second layer 64 may include a variety of materials or structures to produce the energy flux and to expose the resist. For example, either layer may include an active gain material (and may act as an optical cavity for stimulated emission), a nonlinear optical material, an electrode, a photoemitter (e.g., a quantum dot, a fluorescent material, a scintillation material, or a waveguide), a field emitter, or a particle emitter such as a photocathode. Either layer may also be configured to support plasmon propagation.

Figure 4:
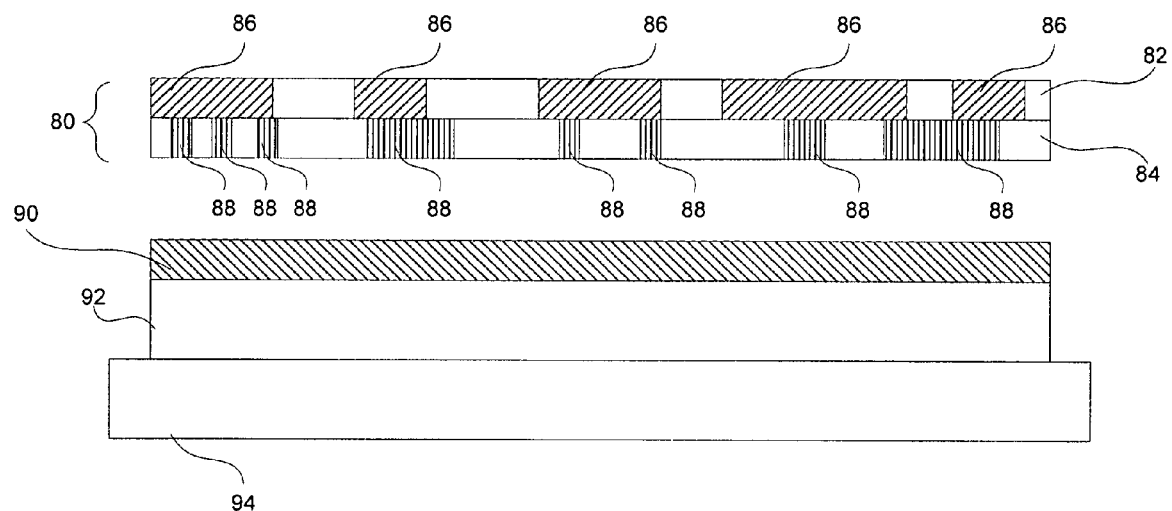
FIG. 4 is a schematic of a bilayer active mask including an energy emitting layer and a transmissivity layer.

FIG. 4 is a schematic of an active mask 80 including a patterned energy emitting layer 82 and a patterned transmissivity layer 84. In the illustrated embodiment, energy emitting layer 82 is a patterned light-emitting layer. In some embodiments, this layer may emit other types of energy fluxes, such as charged particles (e.g., electrons, ions, or holes) or an electromagnetic field. Energy emitting layer 82 includes a plurality of active regions 86, which are stimulated to emit an energy flux by any of the methods described elsewhere herein. Patterned transmissivity layer 84 allows the energy flux to selectively pass through transmissivity areas 88. Transmissivity areas 88 may include a material which is partially or completely transparent to the energy flux, or they may include more complex structures such as waveguides or plasmon propagating regions. In some embodiments, the areas between transmissivity areas 88 may substantially block transmission of the energy flux or may allow a reduced transmission. Energy flux which is transmitted through transmissivity areas 88 exposes resist layer 90. Resist layer 90 (which may be either a positive or negative resist) may then be developed using lithographic techniques. In other embodiments, the resist may be absent, and the active regions may interact directly with the substrate material. The substrate 92 may be supported by a substrate support 94.

Figure 5:
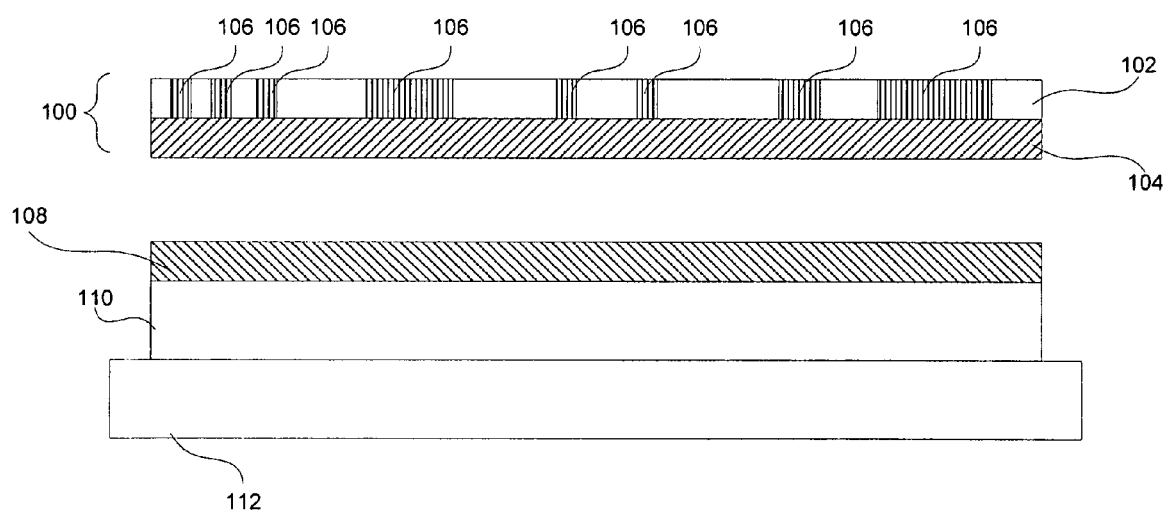
FIG. 5 is a schematic of a bilayer active mask including a transmissivity layer and an energy emitting layer.

FIG. 5 is a schematic of an active mask 100 including a patterned transmissivity layer 102 and an energy emitting layer 104. In the illustrated embodiment, energy emitting layer 104 is a homogeneous light-emitting layer, but this layer may also be patterned with active and inactive regions. In some embodiments, this layer may emit other types of energy fluxes, such as charged particles (e.g., electrons, ions, or holes) or an electromagnetic field. Transmissivity layer 102 includes a plurality of transmission regions 106, which allow an energy input to selectively pass through. Transmissivity areas 106 may include a material which is partially or completely transparent to the energy input, or they may include more complex structures such as waveguides or plasmon propagating regions. In some embodiments, the areas between transmissivity areas 106 may substantially block transmission of the energy input or may allow a reduced transmission. The energy input which is transmitted through transmissivity areas 106 stimulates active layer 104 to produce light (or another energy flux), which exposes resist layer 108. Resist layer 108 (which may be either a positive or negative resist) may then be developed using lithographic techniques. In other embodiments, the resist may be absent, and the energy flux may interact directly with the substrate material. The substrate 110 may be supported by a substrate support 112.

Various beam-shaping, splitting, filtering, polarizing, or other interactive elements (collectively, "beam-directing" elements) may be used in conjunction with the active mask. For example, when the input energy includes an optical input, traditional optical elements such as mirrors, diffractive elements, refractive elements, lenses, or any other optical elements appropriate for the configuration may be used to direct the input energy toward the active mask. Similarly, when the active mask emits an optical output, such optical elements may be used to direct the output from the mask to the substrate. "Optical element," as used herein, is intended to include all elements suitable for changing the direction, focus, polarization, or other properties of an optical energy flux. When an input or output includes an electric field, strategically placed conductors, dielectrics, metamaterials, and/or active components may be arranged to shape the electric field in an analogous fashion. Similarly, such elements or static or dynamic electromagnetic fields may direct beams of charged particles. Those of skill in the art will recognize that a variety of methods for directing energy are available and that various methods are appropriate in particular embodiments depending on the specifics of the mask input and output, substrate, and resist (if any).

In some embodiments, the active mask will be used for contact lithography and/or for proximity printing. In proximity lithography systems, distances between mask and substrate are currently often in the range of about 5 µm to about 100 µm, or of about 10 µm to about 50 µm, but shorter or longer offsets are also contemplated, including effectively zero distances in the case of contact lithography. In particular, since diffraction effects in proximity systems are minimized when offsets are small, it is contemplated that distances between mask and substrate may be as low as about 1 µm, 100 nm, or even 10 nm.

Potential resist materials include traditional photoresists, but also may include materials that have a physical and/or chemical change in the presence of energy inputs, such as lipid bilayers that electroporate in the presence of an electric field. Such bilayers are described, for example, in Bier, et al., "Electroporation of a Lipid Bilayer as a Chemical Reaction," *Bioelectromag.* 25:634-637 (2004), which is incorporated herein by reference. Exposure to an electric field above a minimum field strength causes pores to open (either reversibly or irreversibly, depending on the exposure characteristics). Pores may, for example, admit etchants to the underlying substrate, or as initiation points to selectively remove the lipid bilayer by chemical or other attack. Other materials that undergo a physical and/or chemical change in response to the output of the active mask may also be used as resists (e.g., materials that may be ablated by application of an electron beam may be used in conjunction with an active mask that emits electrons).

Various embodiments of power beaming units, receivers, and associated methods have been described herein. In general, features that have been described in connection with one particular embodiment may be used in other embodiments, unless context dictates otherwise. For example, lipid bilayer resists may be employed in any of the embodiments described herein. For the sake of brevity, descriptions of such features have not been repeated, but will be understood to be included in the different aspects and embodiments described herein.

It will be understood that, in general, terms used herein, and especially in the appended claims, are generally intended as "open" terms (e.g., the term "including" should be interpreted as "including but not limited to," the term "having" should be interpreted as "having at least," the term "includes" should be interpreted as "includes but is not limited to," etc.). It will be further understood that if a specific number of an introduced claim recitation is intended, such an intent will be explicitly recited in the claim, and in the absence of such recitation no such intent is present. For example, as an aid to understanding, the following appended claims may contain usage of introductory phrases such as "at least one" or "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "an active region" should typically be interpreted to mean "at least one active region"); the same holds true for the use of definite articles used to introduce claim recitations. In addition, even if a specific number of an introduced claim recitation is explicitly recited, it will be recognized that such recitation should typically be interpreted to mean at least the recited number (e.g., the bare recitation of "two layers," or "a plurality of layers," without other modifiers, typically means at least two layers). Furthermore, in those instances where a phrase such as "at least one of A, B, and C," "at least one of A, B, or C," or "an [item] selected from the group consisting of A, B, and C," is used, in general such a construction is intended to be disjunctive (e.g., any of these phrases would include but not be limited to systems that have A alone, B alone, C alone, A and B together, A and C together, B and C together, or A, B, and C together, and may further include more than one of A, B, or C, such as $A_1$, $A_2$, and C together, A, $B_1$, $B_2$, $C_1$, and $C_2$ together, or $B_1$ and $B_2$ together). It will be further understood that virtually any disjunctive word or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A lithographic mask, comprising:
   a first energy emitting layer, including:
      a first active region configured to emit a first energy flux at a first selected intensity in response to an energy input; and
   a second energy emitting layer, including:
      a second active region configured to emit a second energy flux at a second selected intensity in response to the first energy flux; and
      a first inactive region configured not to emit an energy flux at the second selected intensity in response to the first energy flux.

2. The mask of claim 1, wherein the first energy flux is electromagnetic radiation.

3. The mask of claim 2, wherein the first energy flux has a first selected frequency, and the second energy flux is electromagnetic radiation having a second selected frequency.

4. The mask of claim 1, wherein the first energy flux is charged particles.

5. The mask of claim 1, wherein the second energy flux is charged particles.

6. The mask of claim 1, wherein the first energy flux is an evanescent wave.

7. The mask of claim 1, wherein the first energy flux is an electromagnetic field.

8. The mask of claim 1, wherein the second energy flux is an electromagnetic field.

9. The mask of claim 1, wherein the first energy emitting layer is photoemissive.

10. The mask of claim 1, wherein the second energy emitting layer is photoemissive.

11. The mask of claim 1, wherein the first energy emitting layer is luminescent.

12. The mask of claim 1, wherein the second energy emitting layer is luminescent.

13. The mask of claim 1, wherein the first energy emitting layer includes an active gain material.

14. The mask of claim 1, wherein the second energy emitting layer includes an active gain material.

15. The mask of claim 14, wherein the second energy emitting layer is configured to function as an optical cavity.

16. The mask of claim 1, wherein the second energy emitting layer includes a nonlinear optical material.

17. The mask of claim 1, wherein the first energy emitting layer includes a quantum dot.

18. The mask of claim 1, wherein the second energy emitting layer includes a quantum dot.

19. The mask of claim 1, wherein the first energy emitting layer includes a fluorescent material.

20. The mask of claim 1, wherein the second energy emitting layer includes a fluorescent material.

21. The mask of claim 1, wherein the second energy emitting layer includes a scintillation material.

22. The mask of claim 1, wherein the second energy emitting layer includes a photocathode.

23. The mask of claim 1, wherein the second energy emitting layer includes a field emission material.

24. The mask of claim 1, wherein the first energy emitting layer includes a waveguide.

25. The mask of claim 1, wherein the second energy emitting layer includes a waveguide.

26. The mask of claim 1, wherein the first energy emitting layer includes a region supporting plasmon propagation.

27. The mask of claim 1, wherein the second energy emitting layer includes a region supporting plasmon propagation.

28. The mask of claim 1, wherein the energy input is an electrical input.

29. The mask of claim 1, wherein the energy input is an optical input.

30. The mask of claim 1, wherein the first energy emitting layer includes a second inactive region configured not to emit an energy flux at the first selected intensity in response to the energy input.

31. A lithographic apparatus, comprising:
   a patterned energy emitting mask, the mask including at least one active region that emits an energy flux and at least one inactive region that does not emit an energy flux; and
   a substrate support arranged to hold a substrate in a position to receive the energy flux,
   wherein the patterned energy emitting mask includes at least two layers, at least one of the at least two layers being an energy emitting layer.

32. The apparatus of claim 31, wherein the at least two layers include two energy emitting layers.

33. The apparatus of claim 32, wherein the at least two layers include a patterned energy emitting layer and a homogeneous energy emitting layer.

34. The apparatus of claim 32, wherein the at least two layers include two patterned energy emitting layers.

35. The apparatus of claim 31, wherein the at least two layers include an energy emitting layer and a patterned transmissivity layer.

36. A lithographic method, comprising:
   generating an energy flux by activating a patterned energy emitting mask, wherein the mask includes at least one active region that emits an energy flux and at least one inactive region that does not emit an energy flux and wherein the mask includes at least two layers, at least one of the at least two layers being an energy emitting layer; and
   exposing a flux sensitive material to the generated energy flux at a level selected to modify the flux sensitive material.

37. The lithographic method of claim 36, wherein the at least two layers include two energy emitting layers.

38. The lithographic method of claim 37, wherein the at least two layers include a patterned energy emitting layer and a homogeneous energy emitting layer.

39. The lithographic method of claim 38, wherein the at least two layers include two patterned energy emitting layers.

40. The lithographic method of claim 36, wherein the at least two layers include an energy emitting layer and a patterned transmissivity layer.

41. A lithographic mask, comprising:
   a patterned energy emitting layer, the layer including:
      at least one active region configured to emit an energy flux at a selected level in response to an energy input; and
      at least one inactive region configured not to emit an energy flux at the selected level in response to the energy input,
   wherein the active region includes a structure selected from the group consisting of an active gain material, a nonlinear optical material, a waveguide, a quantum dot, and a plasmon-supporting region.

42. A lithographic mask, comprising:
   a patterned energy emitting layer, the layer including:

a first active region configured to emit a first energy flux at a first selected level in response to an energy input; and a second active region configured to emit a second energy flux at a second selected level in response to the energy input, wherein the first and second energy fluxes differ in frequency or intensity.

43. The lithographic mask of claim 42, wherein the first and second energy fluxes differ in frequency.

44. The lithographic mask of claim 42, wherein the first and second energy fluxes differ in intensity.

45. The mask of claim 3, wherein the first selected frequency differs from the second selected frequency.

46. The mask of claim 4, wherein the charged particles are electrons.

47. The mask of claim 5, wherein the charged particles are electrons.

48. The mask of claim 7, wherein the electromagnetic field is static.

49. The mask of claim 7, wherein the electromagnetic field is dynamic.

50. The mask of claim 7, wherein the electromagnetic field is purely electric.

51. The mask of claim 7, wherein the electromagnetic field is purely magnetic.

52. The mask of claim 8, wherein the electromagnetic field is static.

53. The mask of claim 8, wherein the electromagnetic field is dynamic.

54. The mask of claim 8, wherein the electromagnetic field is purely electric.

55. The mask of claim 8, wherein the electromagnetic field is purely magnetic.

56. The mask of claim 1, wherein the first energy emitting layer includes an electrode.

57. The mask of claim 1, wherein the second energy emitting layer includes an electrode.

58. The apparatus of claim 31, further comprising a beam-directing element that directs the energy flux toward the substrate.

59. The apparatus of claim 31, wherein the energy flux is electromagnetic radiation.

60. The apparatus of claim 31, wherein the energy flux is electrons.

61. The apparatus of claim 31, wherein the energy flux is an evanescent wave.

62. The apparatus of claim 31, wherein the energy flux is an electromagnetic field.

63. The apparatus of claim 62, wherein the electromagnetic field is static.

64. The apparatus of claim 62, wherein the electromagnetic field is dynamic.

65. The apparatus of claim 62, wherein the electromagnetic field is purely electric.

66. The apparatus of claim 62, wherein the electromagnetic field is purely magnetic.

67. The apparatus of claim 31, wherein the patterned energy emitting mask includes a light emitting diode.

68. The apparatus of claim 31, wherein the patterned energy emitting mask includes a fluorescent material.

69. The apparatus of claim 31, wherein the patterned energy emitting mask includes a luminescent material.

70. The apparatus of claim 31, wherein the patterned energy emitting mask includes a photoemissive material.

71. The apparatus of claim 31, wherein the patterned energy emitting mask includes a nonlinear optical material.

72. The apparatus of claim 31, wherein the patterned energy emitting mask includes an active gain optical material.

73. The apparatus of claim 31, wherein the patterned energy emitting mask includes a quantum dot.

74. The apparatus of claim 31, wherein the patterned energy emitting mask includes an electrode.

75. The apparatus of claim 31, wherein the patterned energy emitting mask includes an input configured to trigger emission of the energy flux.

76. The apparatus of claim 75, wherein the input is configured to trigger emission in response to an optical signal.

77. The apparatus of claim 75, wherein the input is configured to trigger emission in response to an electrical signal.

78. The apparatus of claim 31, wherein the substrate support is configured for relative movement between the substrate and the mask.

79. The lithographic method of claim 36, wherein the generated energy flux is electromagnetic radiation.

80. The lithographic method of claim 36, wherein the generated energy flux is electrons.

81. The lithographic method of claim 36, wherein the generated energy flux is an evanescent wave.

82. The lithographic method of claim 36, wherein generating an energy flux by activating a patterned energy emitting mask includes generating an electromagnetic field.

83. The lithographic method of claim 82, wherein the generating an electromagnetic field includes generating a static electromagnetic field.

84. The lithographic method of claim 82, wherein generating an electromagnetic field includes generating a dynamic electromagnetic field.

85. The lithographic method of claim 82, wherein generating an electromagnetic field includes generating substantially only an electric field.

86. The lithographic method of claim 82, wherein generating an electromagnetic field includes generating substantially only a magnetic field.

87. The lithographic method of claim 36, wherein activating a patterned energy emitting mask includes activating one or more light-emitting diodes.

88. The lithographic method of claim 36, wherein the patterned energy emitting mask includes a luminescent material.

89. The lithographic method of claim 88, wherein activating the patterned energy emitting mask includes inducing fluorescence in the luminescent material.

90. The lithographic method of claim 89, wherein inducing fluorescence in the luminescent material includes exposing the luminescent material to electromagnetic radiation.

91. The lithographic method of claim 88, wherein activating the patterned energy emitting mask includes applying an electric field to the luminescent material, thereby inducing it to luminesce.

92. The lithographic method of claim 36, wherein the patterned energy emitting mask includes an electrode.

93. The lithographic method of claim 92, wherein activating the patterned energy emitting mask includes applying a voltage to the electrode.

94. The lithographic method of claim 93, wherein the electrode is in contact with the substrate during application of the voltage.

95. The lithographic method of claim 36, wherein the patterned energy emitting mask includes a field emissive material.

96. The lithographic method of claim 95, wherein activating the patterned energy emitting mask includes applying a voltage to the field emissive material.

97. The lithographic method of claim 96, wherein the field emissive material is in contact with the substrate during application of the voltage.

98. The lithographic method of claim 36, wherein the flux sensitive material includes a lipid bilayer, and wherein exposing the flux sensitive material to the generated energy flux includes forming pores in the lipid bilayer.

99. The lithographic method of claim 98, further including applying an etchant to the lipid bilayer after forming the pores.

100. The lithographic method of claim 36, wherein the flux sensitive material includes a resist coating, and wherein exposing the flux sensitive material to the generated energy flux includes inducing a chemical change in the resist coating.

101. The lithographic method of claim 36, wherein the exposed flux sensitive material is modified in a pattern corresponding to the pattern of the patterned energy emitting mask.

102. The lithographic mask of claim 101, wherein the active region includes an active gain material.

103. The lithographic mask of claim 101, wherein the active region includes a nonlinear optical material.

104. The lithographic mask of claim 101, wherein the active region includes a waveguide.

105. The lithographic mask of claim 101, wherein the active region includes a quantum dot.

106. The lithographic mask of claim 101, wherein the active region includes a plasmon-supporting region.

* * * * *